US006813160B1

United States Patent
Lee et al.

(10) Patent No.: US 6,813,160 B1
(45) Date of Patent: Nov. 2, 2004

(54) SIGNAL-CARRYING CONDUCTOR GROOMING CIRCUIT BOARD EJECTOR HANDLE

(75) Inventors: Bruce Lee, Danton, TX (US); Jeffrey R. Lau, Frisco, TX (US); Randy Beck, Petaluma, CA (US); Hong Li, Carol Stream, IL (US)

(73) Assignee: Mahi Networks, Inc., Petaluma, CA (US)

( * ) Notice: Subject to any disclaimer, the term of this patent is extended or adjusted under 35 U.S.C. 154(b) by 0 days.

(21) Appl. No.: 10/386,583

(22) Filed: Mar. 11, 2003

Related U.S. Application Data

(60) Provisional application No. 60/368,569, filed on Mar. 28, 2002.

(51) Int. Cl.$^7$ .............................. H05K 5/00; H05K 5/04; H05K 5/06
(52) U.S. Cl. ........................ 361/754; 361/826; 361/797; 361/825; 361/801; 174/72 A; 385/135

(58) Field of Search .................................. 361/754, 801, 361/798, 826, 797, 724, 725, 827, 760, 720, 748; 174/72 A; 379/397; 24/164; 385/135; 248/71

(56) References Cited

U.S. PATENT DOCUMENTS

| | | | | |
|---|---|---|---|---|
| 5,922,997 A | * | 7/1999 | Lecinski | 174/135 |
| 5,999,411 A | * | 12/1999 | Patel | 361/759 |
| 6,597,584 B1 | * | 7/2003 | Ray et al. | 361/798 |

* cited by examiner

*Primary Examiner*—Tulsidas Patel
*Assistant Examiner*—Hung S. Bui
(74) *Attorney, Agent, or Firm*—Blakely, Sokoloff, Taylor & Zafman, LLP

(57) ABSTRACT

An apparatus comprising a handle to insert and eject a circuit board and a signal-carrying conductor routing mechanism formed by the handle to group and route a plurality of signal-carrying conductor.

5 Claims, 3 Drawing Sheets

SIGNAL-CARRYING CONDUCTOR GROOMING CIRCUIT BOARD EJECTOR HANDLE

RELATED APPLICATIONS

This nonprovisional patent application claims the benefit of priority under 35 U.S.C. §119(e) of U.S. patent application Ser. No. 60/368,569, entitled, "Fiber Grooming Printed Circuit Board Ejector Handle," filed on Mar. 28, 2002.

TECHNICAL FIELD

Embodiments of the invention generally relate to the field of circuit boards and, more particularly, to a signal-carrying conductor grooming circuit board ejector handle.

BACKGROUND

A circuit board is a flat board, typically with a faceplate on one edge, that contains one or more electrical components. A circuit board may be a printed circuit board (PCB), including a system board, a motherboard, or the like. Electrical components may be memory devices, discrete electronic devices (e.g., transistors and inductors), cooling fans, power supplies, processors, and a wide variety of other digital, analog, and optical devices.

A circuit board's faceplate typically contains one or more connection sockets (e.g., for optical and/or electrical connections), light emitting diodes (LEDs), labels, bar codes, and similar elements that provide an interface between the circuit board and things that are external to the circuit board. One or more signal-carrying conductors may connect to a circuit board through a connection socket. A signal-carrying conductor may include a wide variety of signal lines including one or more of an optical, electrical, acoustical, and other propagated signal lines. Once the signal-carrying conductors are connected to a circuit board, they may be grouped and routed by a signal-carrying conductor routing mechanism.

A circuit board may be inserted into a rack (or other electrical equipment chassis) that is designed to hold many circuit boards (e.g., a server rack or an optical transport switch router). At least one ejector handle may be used to provide a lever to insert and eject a circuit board from a rack (or other electrical equipment chassis). Conventional ejector handles compete with physically separate conventional signal-carrying conductor routing mechanisms for a portion of the valuable faceplate surface area.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to a system and apparatus to provide a signal-carrying conductor grooming circuit board ejector handle. An embodiment of the invention provides an ejector handle having both a lever and a signal-carrying conductor routing mechanism. In such an embodiment, the lever may be used to insert and eject a circuit board. Additionally, the signal-carrying conductor routing mechanism of such an embodiment may be used to group and route a plurality of signal-carrying conductors. In an alternative embodiment of the invention, a printed circuit board has at least one ejector handle having a lever to insert and eject circuit boards and a signal-carrying conductor routing mechanism formed by the handle to group and route a plurality of signal-carrying conductors.

Figure 1:
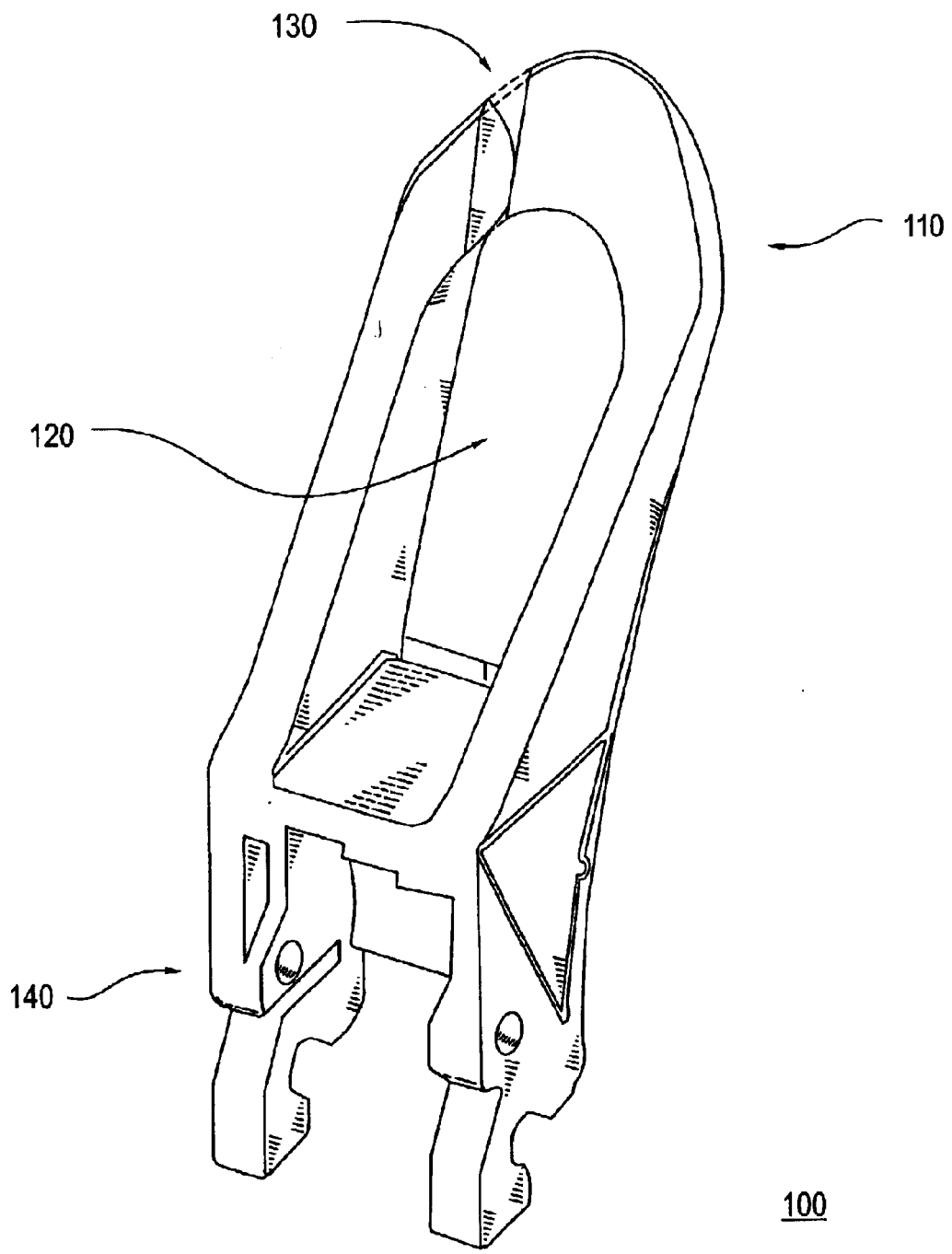
FIG. 1 is a perspective diagram illustrating a signal-carrying conductor grooming circuit board ejector handle implemented according to an embodiment of the FIG. 2 is an illustration of an embodiment of the invention grouping and routing a plurality of signal-carrying conductors.

FIG. 1 is a perspective diagram illustrating ejector handle 100, implemented according to an embodiment of the invention. Ejector handle 100 may include lever 110, signal-carrying conductor routing mechanism 120, opening 130, and ejector base attachment 140. In the illustrated embodiment, ejector base attachment 140 provides a mechanism to attach ejector handle 100 to an off-the-shelf ejector base obtained from any one of a number of electronics equipment suppliers. Ejector bases are well known by those of ordinary skill in the art and will, therefore, not be further described except as to how they pertain to embodiments of the invention.

Ejector handle 100 illustrates that in some embodiments of the invention, signal-carrying conductor routing mechanism 120 is formed by lever 110. In the illustrated embodiment, lever 110 forms a loop, which comprises signal-carrying conductor routing mechanism 120. A person of ordinary skill in the art will appreciate that ejector handle 100 may form signal-carrying conductor routing mechanism 120 in a variety of ways. For example, lever 110 may form a U or Y shape to implement signal-carrying conductor routing mechanism 120. In some embodiments of the invention, signal-carrying conductor routing mechanism 120 may include a latch that may be opened and closed to allow signal-carrying conductors to be inserted or removed. Opening 130 provides a means to insert (as well as remove) signal-carrying conductors from signal-carrying conductor routing mechanism 120.

Signal-carrying conductor routing mechanism 120 (hereinafter, mechanism 120) may group and route one or more signal-carrying conductors. Grouping signal-carrying conductors refers to physically associating a group of signal-carrying conductors with each other. For example, in an embodiment of the invention, an ejector handle employs mechanism 120 to group all signal-carrying conductors attached to a particular circuit board. Routing signal-carrying conductors refers to physically directing signal-carrying conductors toward or away from an object of interest. For example, in an embodiment of the invention, mechanism 120 routes a plurality of signal-carrying conductors away from the surface of a faceplate so that features of the faceplate are more accessible. Grooming signal-carrying conductors refers to grouping and routing as well as other functions. In an embodiment of the invention, mechanism 120 groups and routes a plurality of optical signal lines (e.g., fibers).

Figure 2:
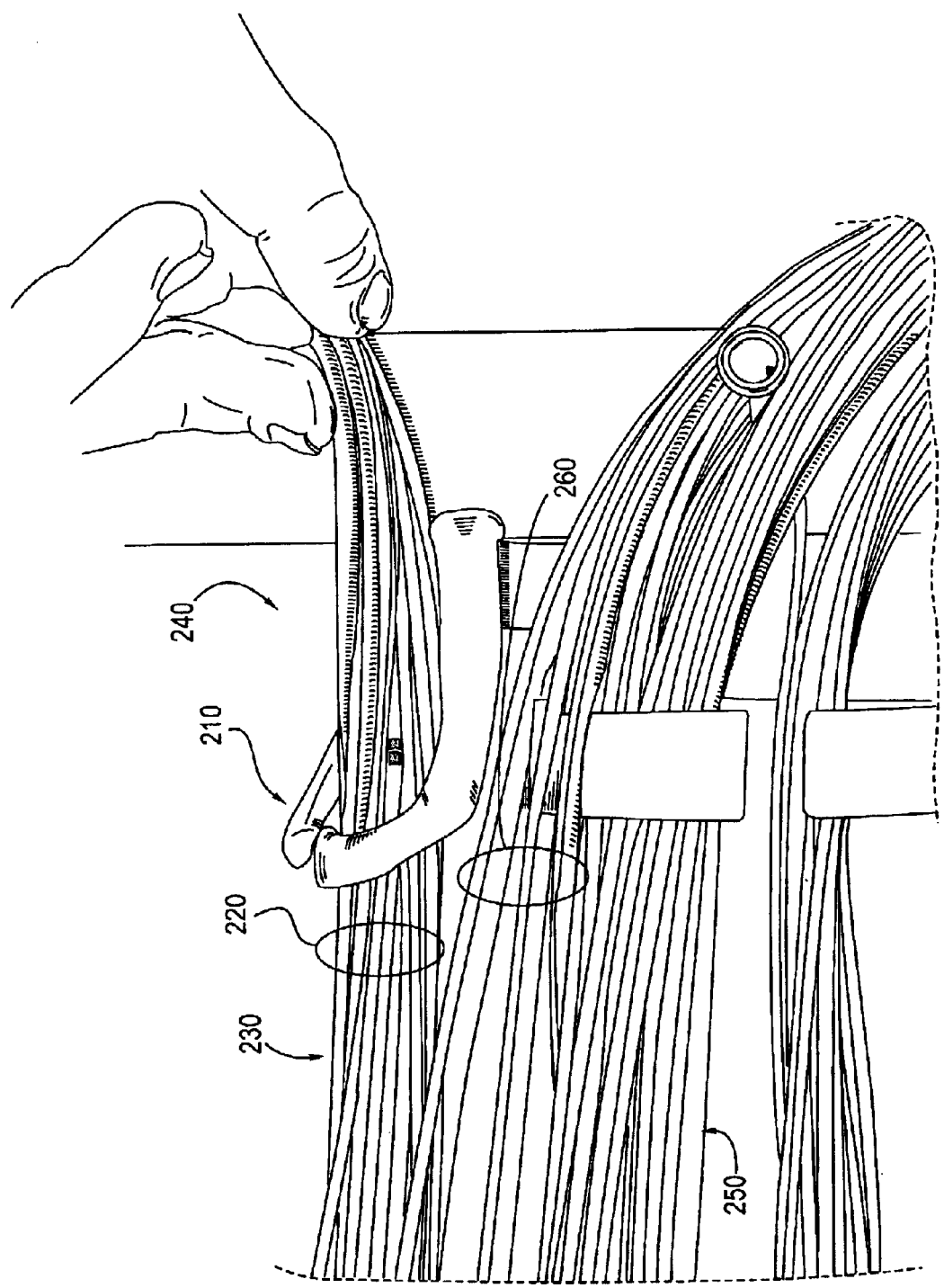

FIG. 2 is an illustration of an embodiment of the invention grouping a plurality of signal-carrying conductors. FIG. 2 shows ejector handle 210 implemented according to an embodiment of the invention. In the illustrated embodiment, ejector handle 210 is connected to faceplate 230. Ejector handle 210 efficiently grooms and groups a plurality of fibers 220. Ejector handle 210 clearly separates the plurality of fibers 220 from adjacent faceplates 240 and 250. In contrast, a plurality of fibers 260 is not grouped by a signal-carrying conductor routing mechanism. In the absence of a signal-carrying conductor routing mechanism, plurality of fibers 260 obscures access to faceplate 230.

One advantage of an apparatus that includes both an ejector handle lever and a signal-carrying conductor routing mechanism is that such an apparatus occupies less space than would be required if the two features were implemented in two physically separate devices. Saving space is an important consideration in circuit board design for many reasons including the need to accommodate a large number of features (e.g., LEDs, bar codes, signal-carrying conductor connections) on the limited space of a faceplate.

Figure 3:
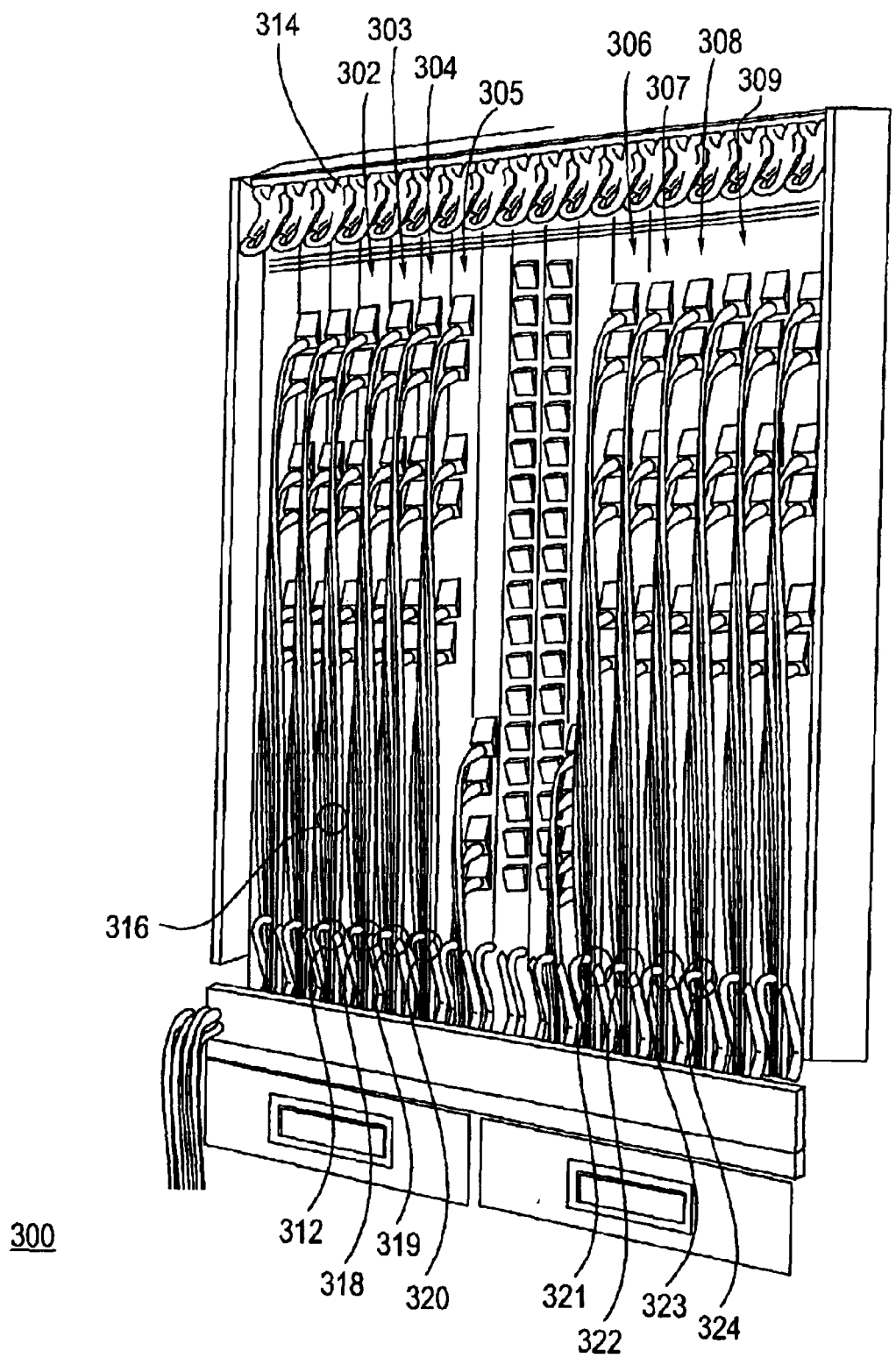
FIG. 3 illustrates selected elements of switch 300, containing a number of circuit boards implemented according to an embodiment of the invention.

FIG. 3 illustrates selected elements of electronic equipment chassis 300, which contains a number of circuit boards implemented according to an embodiment of the invention. Electronic equipment chassis 300 may include circuit boards 302–309. Circuit boards 302–309 are inserted into electronic equipment chassis 300 so that access to circuit boards 302–309 is through their respective faceplates.

Circuit board 302 includes ejector handles 312 and 314, which are implemented according to an embodiment of the invention. Ejector handle 312, for example, captures, isolates and neatly routes a plurality of fibers 316 which attach to circuit board 102. Ejector handles, 318–324 similarly, capture, isolate, and neatly route fibers attached to circuit boards 303–309, respectively. Thus, operators know which fibers attach to which boards, thereby, preventing errors and telecommunications traffic disruption that could result if the wrong fibers were removed during maintenance. Also, ejector handle 312 enables circuit board 302 to be partially ejected without removing the plurality of fibers 316. This provides an additional means of clearly isolating the fibers for circuit board maintenance.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An apparatus comprising:

a handle by which to insert and eject a circuit board; and a signal-carrying conductor routing mechanism provided by the handle formed as a single piece in an open loop, the opening in the loop through which to insert a signal-carrying conductor, to group and route a plurality of signal-carrying conductors.

2. The apparatus of claim 1, wherein the signal-carrying conductor routing mechanism comprises a fiber optic cable routing mechanism.

3. A circuit board comprising:

one or more electrical components; and at least one ejector handle having a lever to insert and eject the circuit board from an electronic equipment chassis and a signal-carrying conductor routing mechanism provided by the handle formed as a single piece in an open loop, the opening in the loop through which to insert a signal-carrying conductor, to group and route a plurality of signal-carrying conductors.

4. The circuit board of claim 3, wherein the signal-carrying conductor routing mechanism formed by the handle to group and route a plurality of signal-carrying conductors comprises a fiber optic cable routing mechanism.

5. An apparatus comprising:

a handle to insert and eject a circuit board from an electronic equipment chassis; and a cable routing mechanism provided by the handle formed as a single piece in an open loop, the opening in the loop through which to insert a cable, to group and route a plurality of cables.

\* \* \* \* \*